United States Patent
Okamoto et al.

(10) Patent No.: US 6,528,860 B2
(45) Date of Patent: Mar. 4, 2003

(54) RESISTOR WITH RESISTANCE ALLOY PLATE HAVING ROUGHENED INTERFACE SURFACE

(75) Inventors: Kenji Okamoto, Kanagawa (JP); Kazuhiko Imamura, Mie (JP); Mayumi Matsumoto, Tokyo (JP); Yuzo Saito, Tokyo (JP); Jun Fujiki, Fukui (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/005,209

(22) Filed: Dec. 5, 2001

(65) Prior Publication Data
US 2002/0140038 A1 Oct. 3, 2002

(30) Foreign Application Priority Data
Dec. 5, 2000 (JP) .......................... 2000-370615

(51) Int. Cl.[7] .............................. H01C 1/08; H01L 29/00
(52) U.S. Cl. ........................ 257/536; 257/577; 338/51
(58) Field of Search ................... 257/577, 536; 338/51

(56) References Cited

U.S. PATENT DOCUMENTS

| | | | | |
|---|---|---|---|---|
| 4,677,413 A | * | 6/1987 | Zandman et al. | 338/195 |
| 5,945,905 A | * | 8/1999 | Mazzochette | 338/309 |
| 5,990,780 A | * | 11/1999 | Caddock, Jr. | 338/309 |
| 6,144,286 A | * | 11/2000 | Moos et al. | 29/610.1 |

FOREIGN PATENT DOCUMENTS

| | | |
|---|---|---|
| JP | 7-192902 | 7/1995 |
| JP | 10-149901 | 6/1998 |

* cited by examiner

*Primary Examiner*—David Nelms
*Assistant Examiner*—Tu-Tu Ho
(74) *Attorney, Agent, or Firm*—Rossi & Associates (57) ABSTRACT

A high-accuracy current detecting resistor is provided whose resistance does not change greatly according to temperature change and which has an excellent dielectric strength. In a resistor in which an electrical resistance alloy plate and a radiating metallic plate are laminated via a resin insulating layer, the electrical resistance alloy plate is formed of an alloy containing nickel and copper and is adhered to the resin insulating layer by etching a grain boundary of the alloy in the form of a concave.

6 Claims, 7 Drawing Sheets

Fig. 8

RESISTOR WITH RESISTANCE ALLOY PLATE HAVING ROUGHENED INTERFACE SURFACE

FIELD OF THE INVENTION

The present invention relates to a current-detecting resistor for use in a power converting apparatus such as an inverter.

BACKGROUND

Figure 1:
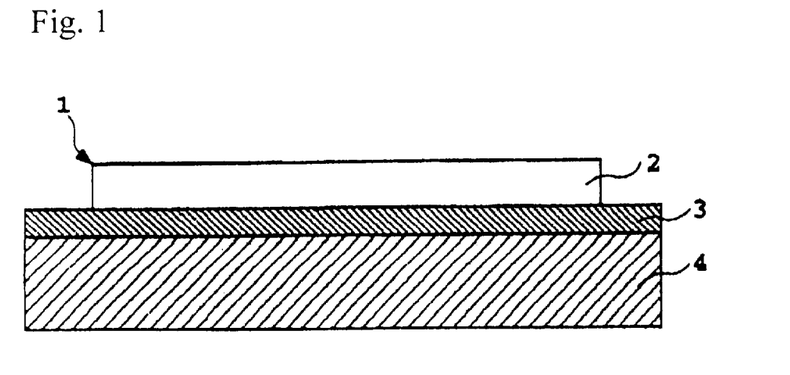
FIG. 1 is a sectional view showing a resistor.

In a power converting apparatus such as an inverter or a power module mounting thereon an IGBT device or the like, there is provided a high accuracy resistor of about 0.1 to 100 mΩ so as to accurately detect a heavy current of between several A and 400 A. The power converting apparatus must radiate since the resistor generates a large amount of power due to the heavy current. As a means for radiation, a resistor is used which is constructed by laminating a resistance alloy plate 2 and a radiating metallic plate 4 via a resin insulating layer 3 as shown in FIG. 1. Such a resistor comprised of laminated three layers is disclosed in Japanese Patent Publication No. 3-16799 and Japanese Patent Laid-Open Publication No. 10-149901.

A copper manganese alloy, a copper manganese nickel alloy, or a copper nickel alloy having a high resistivity is used as a resistance alloy in order to detect electric current with a high accuracy. A manganin is known as an example of the copper manganese nickel alloy. Trade names such as Advance or Ideal containing a small amount of Mn, Fe and Si as well as a constantan are known as examples of the copper nickel alloy.

The above-mentioned laminated resistor, however, has several problems that will be discussed in greater detail.

Figure 2:
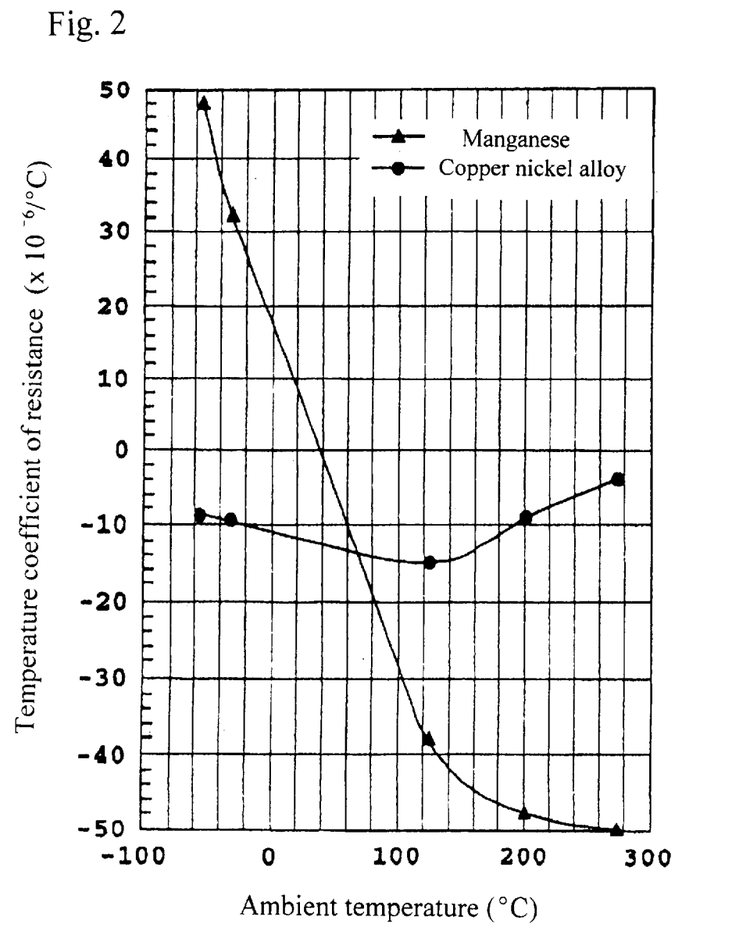
FIG. 2 is a graph showing the relationship between the peripheral temperature of the temperature coefficient of resistance copper manganese alloy and copper nickel alloy.

FIG. 2 shows the temperature coefficient of resistance at the respective temperatures of a manganin (containing 85% copper, 12% manganese, 2% nickel, and 1% iron) as a typical copper manganese nickel alloy, and the copper nickel alloy (containing 54.5% copper, 43.7% nickel and 1.8% manganese). In the case of the copper manganese alloy or the copper manganese nickel alloy that has been in a relatively wide use, the absolute value of the temperature coefficient of resistance is as extremely small as 10 ppm/° C. or less if the ambient temperature lies inside a range of a normal temperature to 60° C., but is increased as the ambient temperature is raised or lowered to go out of this range. To the contrary, in the case of the copper nickel alloy, the absolute value of the temperature coefficient of resistance is constant at 15 ppm/° C. or less irrespective of the ambient temperature. Therefore, the power converting apparatus whose ambient temperature is increased to 100° C. requires the use of the copper nickel alloy that exhibits a small temperature coefficient of resistance when the peripheral temperature is high.

Joule's heat is generated in the resistance alloy plate 2 when carrying current. In order to correctly measure the current, the resistor for use in the power converting apparatus must control the rise in the temperature of the resistance alloy plate 2 so as to prevent the temperature of atmosphere inside the power converting apparatus from rising due to the generated heat. The laminated resistor radiates and cools the generated heat through the resin insulating layer 3. Accordingly, the heat conductivity of the resin insulating layer 3 is desired to be as high as possible.

Adding a larger amount of inorganic filler material is more advantageous in increasing the heat conductivity. The amount of inorganic filler material added to resin material for the conventional laminated resistor is 70 wt % at the most, and the resistor has a low heat conductivity and a high heat resistance. Therefore, the cooling property is not satisfactory. If a heavily-filled resin material with inorganic filler material of 80 to 90 wt % added thereto in order to improve the radiating property, the contact surface area between the filler material and the metallic surface is decreased to deteriorate the adhesiveness with respect to the resistance alloy plate 2. To improve the adhesiveness, the adhesion surface is usually roughened. An electrolytic copper foil or the like for use in a printed circuit board is roughened over a depth of 5 to 15 μm. Even a heavily-filled resin material with inorganic filler material of 80 to 90 wt % being added thereto has as a strong anchoring effect. In the case of a rolled copper foil having a smooth surface, a needle crystal of oxidized copper is grown on the surface to toughen the surface in a so-called blackening process. Recently, the surface of copper has been roughened over a depth of several μm in a so-called micro-etching process.

A rolled plate serving as the resistance alloy plate 2 for use in conventional laminated resistors has a smooth surface. For this reason, the surface cannot be roughened unless the roughing process is carried out, as is the case with a rolled foil. As is the case with the rolled copper foil, the above-mentioned copper manganese alloy or copper manganese nickel alloy can easily be blackened or micro-etched since it contains a large amount of copper; 82 to 85%. To the contrary, the copper nickel alloy whose temperature coefficient of resistance is constant at a low level in a wide temperature range is essentially difficult to oxidize, and it is therefore difficult to roughen the copper nickel alloy like the copper manganese alloy or the copper manganese nickel alloy.

If the resistor is mounted directly on a metallic plate of a power module with an earthing potential to enable efficient cooling, the circuit voltage of the power converting apparatus is applied to the insulating resin layer 3. The applied circuit voltage may reach about 1000 Vp (peak voltage) at the most. Accordingly, the insulating resin layer 3 needs to have a high dielectric strength and maintain it for a long period of time.

In view of the above, it would be desirable to provide a resistor for use in a power converting apparatus, which is capable of achieving a high adhesive strength between a resistance copper nickel alloy plate and a heat conductive resin material, a low heat resistivity, an excellent cooling property, and an excellent insulating property.

It would further be desirable to provide a resistor for use in a power converting apparatus, which is capable of achieving a small temperature coefficient of resistance within a wide temperature range, a high accuracy in current detection, a high adhesive strength between a resistance plate and a heat conductive resin material, a high heat conductivity, an excellent cooling property, and an excellent insulating property.

SUMMARY OF THE INVENTION

A resistor is provided wherein an electrical resistance alloy plate and a radiating metallic plate are laminated via a resin insulating layer 3, the electrical resistance alloy plate is formed of an alloy containing nickel of 42.0 to 48.0 wt %, manganese of 0.3 to 2.5 wt %, and copper on the basis of the total weight of the alloy with the total content of copper, nickel and manganese being not less than 98 wt %, and has a thickness of 1 mm or more, and a grain boundary thereof is etched in the form of a concave so that the electrical resistance alloy plate can be adhered to the resin insulating layer.

BRIEF DESCRIPTION OF THE DRAWINGS

The invention will now be described with reference to certain preferred embodiments thereof, wherein.

DETAILED DESCRIPTION OF THE PREFERRED EMBODIMENTS OF THE INVENTION

A copper nickel alloy for use in the present invention is an alloy including nickel of 40 to 50 wt % and copper of 60 to 50 wt % on the basis of the total weight of the alloy. More preferably, the copper nickel alloy includes nickel of 42.0 to 48.0 wt % and copper of 58.0 to 52.0 wts %. The copper nickel alloy is comprised mainly of copper and nickel, but may also contain a small amount of another metal (e.g. Mn, Fe, and Si) insofar as the absolute value of the temperature coefficient of resistance is not increased. For example, the copper nickel alloy for use in the present invention includes nickel of 42.0 to 48.0 wt %, a manganese of 0.3 to 0.5 wt %, and copper with the total content of the copper, nickel, and manganese being not less than 98 wt %. The copper nickel alloy having the above-mentioned composition has a temperature coefficient of resistance within the range of ±20 ppm/° C., and more preferably, −15 to 15 ppm/° C. when the temperature is between −50° C. and 200° C.

According to the present invention, an electrical resistance alloy plate 2 formed of the copper nickel alloy has a thickness of 0.1 mm or more, and more preferably, 0.1 to 0.5 mm.

The electrical resistance alloy plate 2 formed of the copper nickel alloy according to the present invention is preferably roughened by using an organic acid etching agent. Examples of organic acid for use in the organic acid etching agent according to the present invention are saturated fatty acid such as formic acid, acetic acid, propionic acid, butyric acid, valeric acid, and capronic acid; unsaturated fatty acid such as acrylic acid, crotonic acid, and isocrotonic acid; aliphatic saturated dicarboxylic acid such as oxalic acid, malonic acid, succinic acid, glutaric acid, adipinic acid, and pimelic acid; aliphatic unsaturated dicarboxylic acid such as maleic acid; aromatic carboxylic acid such as benzoic acid, phthalic acid, and cinnamic acid; oxycarbonic acid such as glycolic acid, lactic acid, malic acid, and citric acid; carbonic acid with substitutent, such as sulphamine acid, β-chloropropionic acid, nicotinic acid, ascorbic acid, hydroxypivalic acid, levulinic acid; and derivatives therefrom. These organic acids can be used singly or in combination. Preferably, the formic acid is used as material for the organic etching agent according to the present invention. As the need arises, the organic acid etching agent may contain an additive (e.g. a second copper ion source and a halogen ion source). Preferably, the organic acid etching agent for use in the present invention is an aqueous solution that contains a combination of organic acid, the second copper ion source and the halogen ion source of 10 to 20 wt % and has a pH of 3.0 to 3.5.

The roughing process is usually carried out for 30 seconds to 3 minutes according to the type and concentration of the organic acid etching agent to be used. Usually, the roughing process is performed by jetting an etching agent with a spray pressure of 0.15 to 0.2 Mpa at a temperature within the range of 25 to 40° C., and more preferably, within the range of 30 to 40° C.

The above-described roughing process forms a concave cavity with a depth of several $\mu$m along a crystal boundary of the copper nickel alloy. Specifically, the surface of the copper nickel alloy is roughened to improve the adhesiveness in the subsequent adhesion to a resin insulating layer 3.

The insulating resin layer 3 for use in the present invention is composed of epoxy resin containing inorganic filler material. The resin insulating layer 3 must have a high heat conductivity (low heat resistance) in order to efficiently transmit heat from the electrical resistance alloy plate 2 to a radiating metallic plate 4. To realize the high heat conductivity, the resin insulating layer 3 according to the present invention contains the inorganic filler material of 71 to 95 wt % (on the basis of the total weight of the resin insulating layer), and more preferably, 71 to 90 wt % (on the basis of the total weight of the resin insulating layer).

The epoxy resin for use in the present invention is comprised of bisphenol A epoxy resin, or a mixture of bisphenol A epoxy rein and phenol novolak epoxy resin. The inorganic filler material for use in the present invention is comprised of $SiO_2$, $Al_2O_3$, BN, AlN, or MgO, or a mixture thereof.

The resin insulating layer 3 according to the present invention may be prepared in the form of a dispersed liquid or solution to be coated on the electrical resistance alloy 2 or the radiating metallic plate 4. Methyl ethyl ketone or toluene can be used as a solvent.

As stated above, in the case where the resistor according to the present invention is mounted directly on a metallic plate of a power module with an earthing potential, a voltage of about 1000 Vp (peak voltage) at the most may possibly be applied to the resin insulating layer 3. Accordingly, the resin insulating layer 3 is required to have a high dielectric strength and maintain it for a long period of time. Moreover, the resin insulating layer 3 is requited to have a preferable adhesiveness with respect to the electrical resistance alloy plate 2 and the radiating metallic plate 4. To satisfy these requirements, the insulating resin layer 3 has a thickness of 50 to 200 $\mu$m, and more preferably, 50 to 150 $\mu$m. The insulating resin layer 3 has a dielectric strength of 5 kVrms (root mean square voltage) or more, and more preferably, 6 kVrms or more. Due to such dielectric strength, the resistor according to the present invention does not cause breakdown for a long period of time even if it is mounted directly on a metallic plate of a power module with an earthing potential.

According to the present invention, a metallic plate formed of copper or aluminium having a high heat conductivity is preferably used as the radiating metallic plate 4. Similarly to the resistance alloy plate 2, the surface of the radiating metallic plate 4 adhered to the insulating resin layer 3 must be roughened so that it can be adhered to the heat conductive resin (insulating resin layer 3). The surface of the radiating metallic plate 4 can be roughened in a conventional method whatever material is used. If the copper is used, the surface can be roughened by an oxidization process called a blackening process wherein a needle crystal is formed. If the aluminium is used, an anodic oxide coating process can roughen the surface. Further, a fin or a prism may be provided on a surface of the radiating metallic plate 4 at the opposite side of the insulating resin layer 3 to increase the surface area to thus improve the radiating efficiency.

The insulating resin layer 3 may be adhered to the electrical resistance alloy plate 2 and to the radiating metallic plate 4 by hot-pressing. The insulating resin layer 3, which is coated on the radiating metallic plate 4 and is dried until resin is half hardened, is laminated on the electrical resistance alloy plate 2 so that the insulating resin layer 3 can be adhered to the electrical resistance alloy plate 2 during the hot-pressing. Alternatively, the insulating resin layer 3, which is coated on the electrical resistance alloy plate 2 and is dried until resin is half hardened, may be laminated on the radiating metallic plate 4 and adhered to it during the hot-pressing. Alternatively, it is possible to use an insulating resin layer donating sheet that is produced by coating the insulating resin layer 3 on a temporary support such as a PET and then drying it until resin is half hardened. In this case, the insulating resin layer donating sheet is placed on the electrical resistance alloy plate 2 or the radiating metallic plate 4 so as to bring the insulating resin layer 3 into close contact with the electrical resistance alloy plate 2 or the radiating metallic plate 4, and the insulating resin layer 3 is temporarily adhered to the electrical resistance alloy plate 2 or the radiating metallic plate 4 by applying heat or the like. The temporary support is then detached from the insulating resin layer 3 to form a lamination of the insulating resin layer 3 and the electrical resistance alloy plate 2 or the radiating metallic plate 4. The radiating metallic plate 4 or the electrical resistance alloy plate 2 is laminated on the lamination, and they are adhered to each other during the hot-pressing to thus form the resistor according to the present invention. During the adhesion, a pressure of 4.9 Mpa (50 kgf/cm$^2$) is applied at a temperature of 180° C. for sixty minutes.

Finally, the copper nickel plate serving as the electrical resistance alloy plate 2 is etched in predetermined patterns by using chemical such as ferric chloride and copper chloride. Each of the resulting patterns is divided by pressing or V-cutting to form a single resistor.

A first embodiment will now be described. A roughening process is performed to roughen the surface of a copper nickel alloy plate containing 54.5 wt % copper, 43.7 wt % nickel and 1.8 wt % manganese and having a thickness of 0.2 mm was reviewed. The SEM photographs (a magnification of 2,000 diameters) in FIG. 3 to FIG. 8 show the results of the roughening process in various methods.

Figure 3:
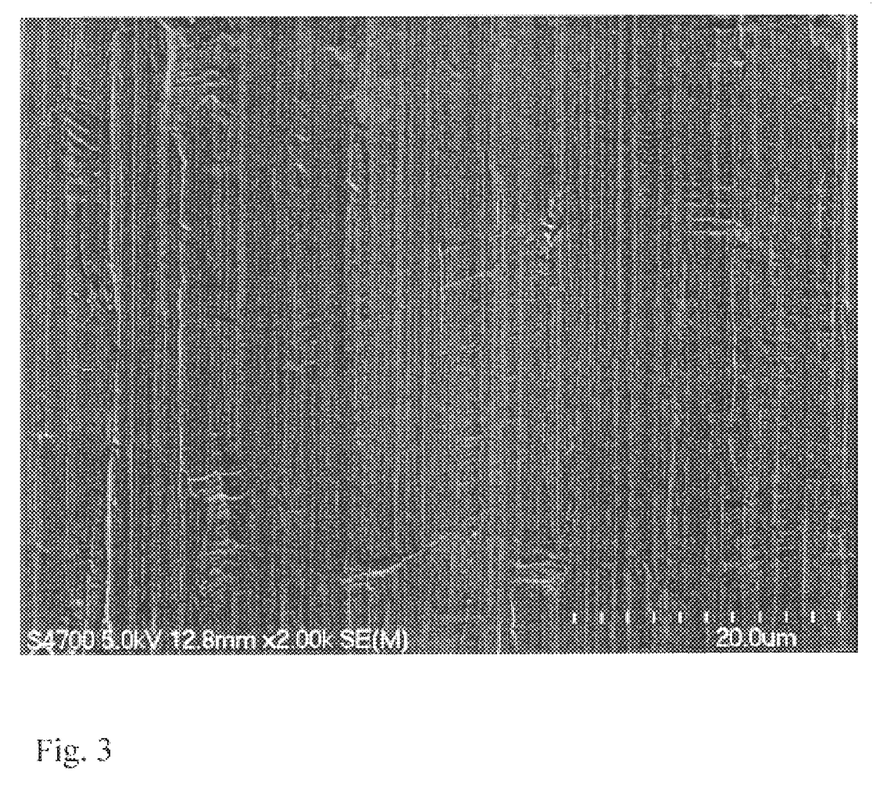
FIG. 3 is an SEM photograph showing the surface of copper nickel alloy plate.

FIG. 3 is the SEM photograph showing the surface of an unprocessed copper nickel alloy plate. The surface of the copper nickel alloy plate is smoothened by rolling.

Figure 4:
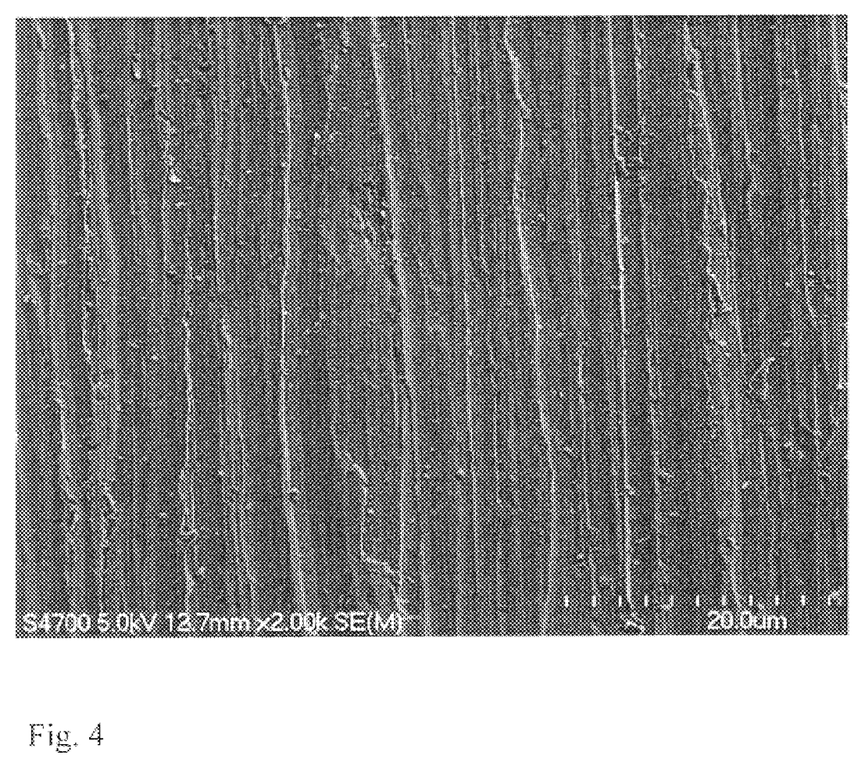
FIG. 4 is an SEM photograph showing a copper nickel alloy plate that is mechanically polished by a #320 unwoven fabric.

FIG. 4 is the SEM photograph showing the surface of a sample 1 that is mechanically polished by a #320 unwoven fabric. The surface is not roughened although a small amount of seams are formed thereon.

Figure 5:
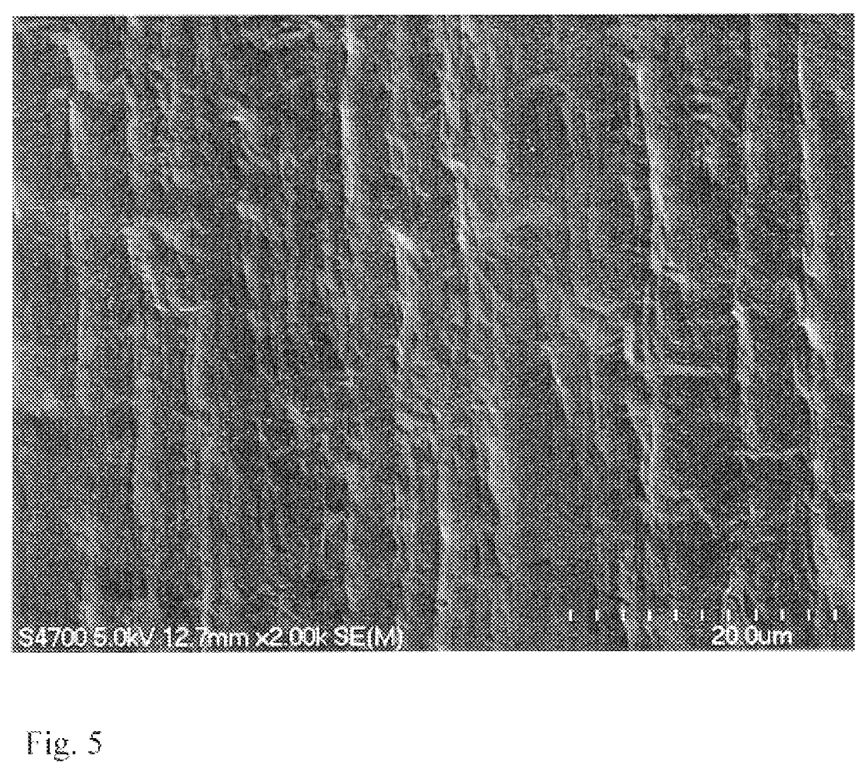
FIG. 5 is an SEM photograph showing a copper nickel alloy plate that is roughened by electrolytic polishing.

FIG. 5 is the SEM photograph showing the surface of a sample 2 that is electrolytically polished by using chromic acid. Similarly to the sample 1, the surface of the copper nickel alloy plate is not roughened.

Figure 6:
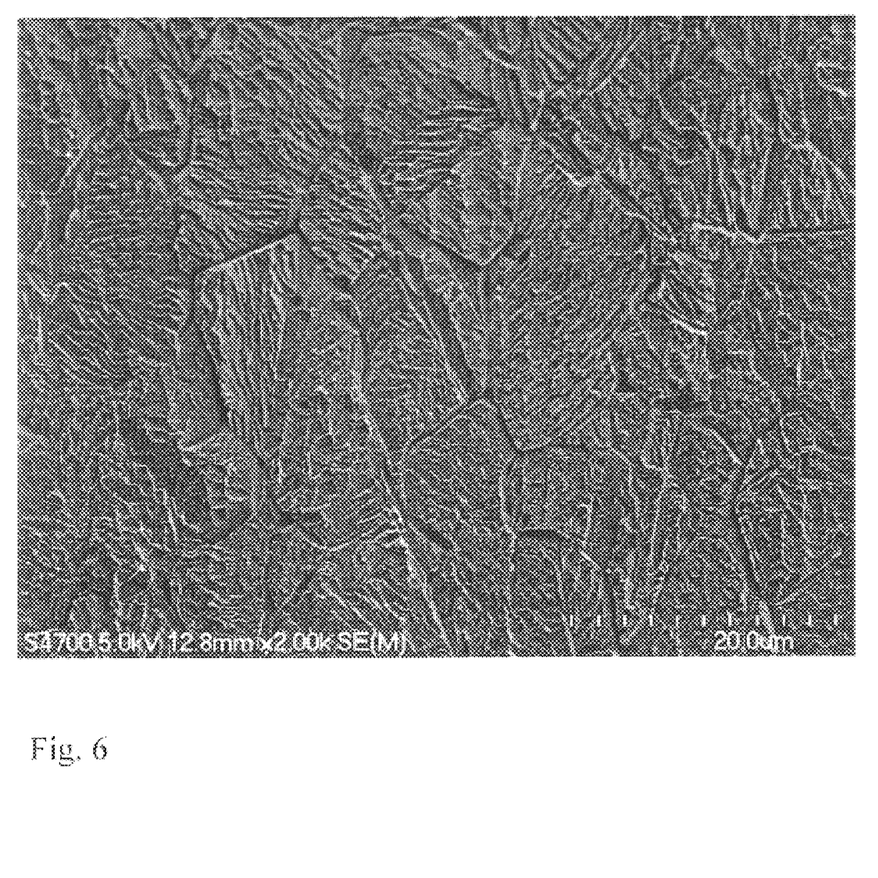
FIG. 6 is an SEM photograph showing a copper nickel alloy plate that is roughened by a nitrate etching agent.

FIG. 6 is the SEM photograph showing the surface of a sample 3 that is roughened by a nitrous acid etching agent. A small amount of seams are formed on the surface.

Figure 7:
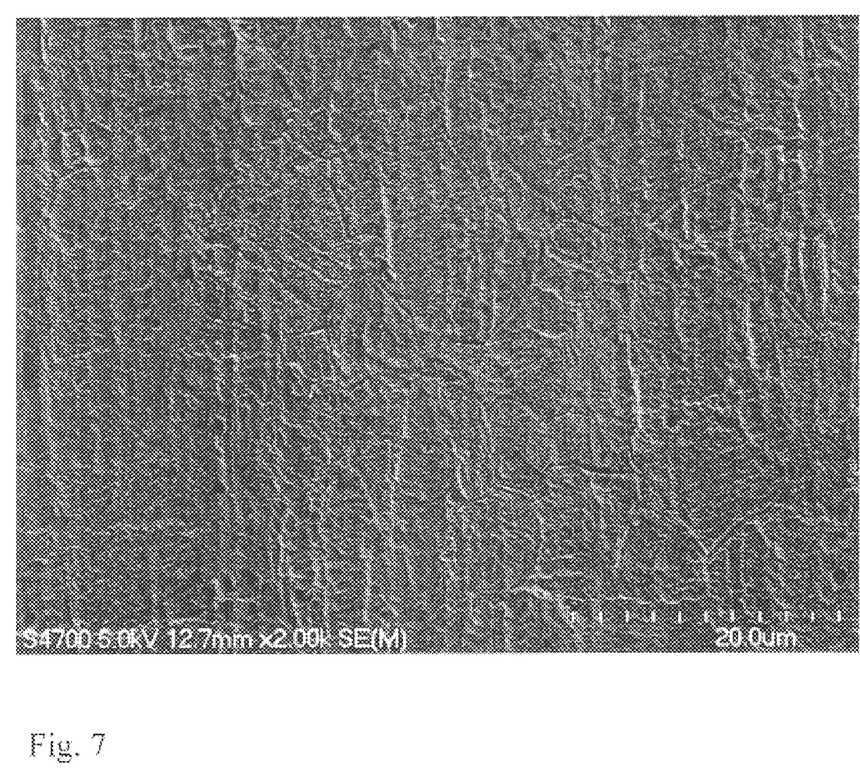
FIG. 7 is an SEM photograph showing a copper nickel alloy that is roughened by a hydrochloric acid etching agent.

FIG. 7 is the SEM photograph showing the surface of a sample 4 that is roughened by a hydrochloric acid etching agent. The surface is not roughened.

Figure 8:
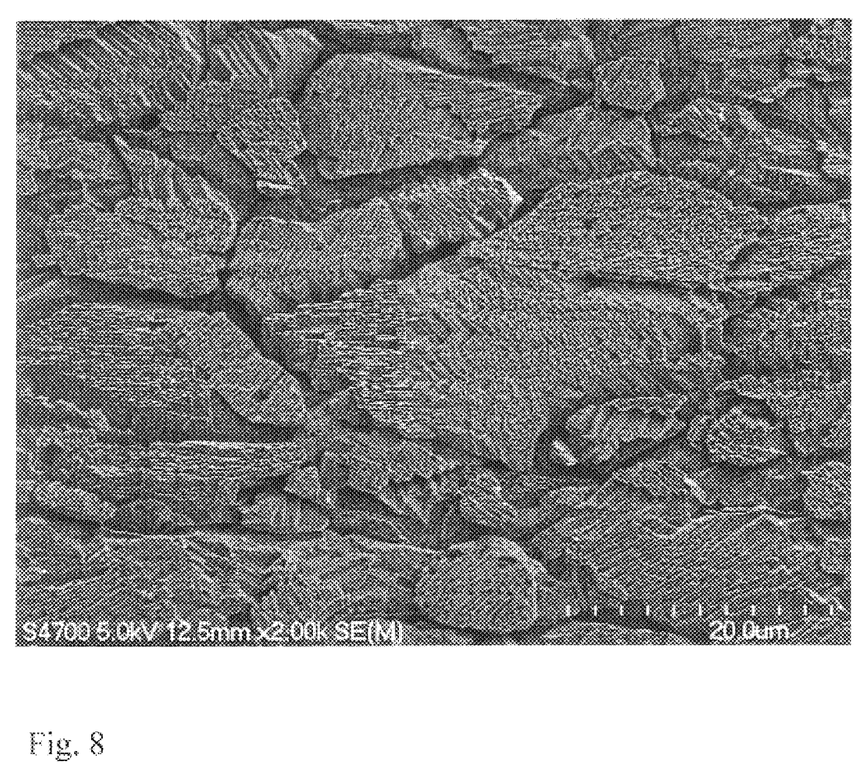
FIG. 8 is an SEM photograph showing a copper nickel alloy plate that is roughened by an organic acid etching agent.

FIG. 8 is the SEM photograph showing the surface of a sample 5 that is roughened by jetting a formic acid-based organic acid etching agent under a spray pressure of 0.15 Mpa at a temperature of 35° C. A hollow with a depth of several $\mu$m is formed along a grain boundary of the copper nickel alloy.

As stated above, the surface of the copper nickel alloy according to the present invention cannot be satisfactorily roughened by electrolytic polishing using the chromic acid or etching using the nitrous acid or hydrochloric acid etching agent as in the conventional method. According to the present invention, however, the grain boundary of the copper nickel alloy can be etched in the form of a concave by roughening with the organic acid etching agent.

Next, a copper nickel alloy plate with a width of 150 mm, a length of 500 mm and a thickness of 0.2 mm, roughened in the above-mentioned manners, and an aluminium plate with a thickness of 2 mm were laminated via an epoxy resin insulating material filled with an $SiO_2$ filler. The insulating material contains an $SiO_2$ filler of 80 wt %, and is formed of bisphenol A epoxy resin. The copper nickel alloy plate was adhered to the insulating material by using a hot presser for sixty minutes at a temperature of 180° C. under a pressure of 4.9 Mpa. The insulating layer had a thickness of 125 $\mu$m. After the insulating layer was completely hardened, the laminated copper nickel alloy plate was etched into the size of 10×10 mm by ferric chloride.

A jig for measuring the tensile strength was soldered to the laminated plate, and a tensile tester evaluated the tensile strength. The adhesive strength of the samples 1 to 3 was as small as 160 N/cm$_2$, but the adhesion strength of the sample 5 was as large as 654 N/cm$^2$.

TABLE 1

| Sample No. | | Adhesive strength (N/cm$^2$) |
|---|---|---|
| 1 | Mechanical polishing by #320 unwoven fabric | 17.5 |
| 2 | Electrolytic polishing | 21 |
| 3 | Nitrous acid etching agent | 157 |
| 5 | Organic acid etching agent | 654 |

In a second embodiment, The breakdown voltage of the laminated plate fabricated in the embodiment 1 was measured by changing the thickness of the insulating resin layer 3 therein. TABLE 2 shows the results of the measurement. As is apparent from TABLE 2, the dielectric strength (breakdown voltage) required for the resistor can be realized when the insulating resin layer 3 had a thickness of 50 μm or more.

TABLE 2

| Thickness (μm) | Breakdown voltage (kVrms) |
|---|---|
| 50 | 6 |
| 100 | 9 |
| 150 | 11 |
| 200 | 15 |

According to the present invention, the use of the electrical resistance alloy plate formed of the copper nickel alloy enables the use of the resistor for a power converting apparatus such as an inverter. Also, the present invention provides a high accuracy current-detecting resistor whose resistance does not change greatly according to temperature change. Further, the surface of the copper nickel alloy is roughened by the organic acid etching agent to thus improve the strength of adhesion between the alloy and the insulating resin layer containing a large amount of inorganic filler material. In addition, the use of the insulating resin layer containing a large amount of inorganic filler material provides a resistor having excellent radiation characteristics and dielectric strength.

What is claimed is:

1. A resistor comprising:

an electrical resistance alloy plate formed of an alloy containing nickel of 42.0 to 48.0 wt %, manganese of 0.3 to 2.5 wt %, and copper on the basis of a total weight, the total content of copper, nickel and manganese being not less than 98 wt % and a grain boundary of the alloy being etched in a form of a concave;

a resin insulating layer laminated on said electrical resistance alloy plate; and a radiating metallic plate laminated on a surface of said resin insulating layer at an opposite side of said electrical resistance alloy plate.

2. A resistor according to claim 1, wherein said electrical resistance alloy plate has a thickness of 0.1 mm or more.

3. A resistor according to claim 1 or 2, wherein the alloy is etched by using an organic acid etching agent.

4. A resistor according to claim 1 or 2, wherein said resin insulating layer is an epoxy resin containing an inorganic filler of 71 to 95 wt % and having a high heat conductivity.

5. A resistor according to claim 1 or 2, wherein said resin insulating layer has a thickness of 50 to 200 μm and a breakdown voltage of 5 kVrms or more.

6. A resistor according to claim 1 or 2, wherein said radiating metallic plate is composed of copper or aluminium.

* * * * *